United States Patent [19]

Tanaka et al.

[11] Patent Number: 4,638,249

[45] Date of Patent: Jan. 20, 1987

[54] INCREMENTAL ENCODER ROTATIONAL POSITION DETECTOR

[75] Inventors: Hiroaki Tanaka; Shigeyuki Akita, both of Okazaki, Japan

[73] Assignee: Nippon Soken, Inc., Nishio, Japan

[21] Appl. No.: 340,254

[22] Filed: Jan. 18, 1982

[30] Foreign Application Priority Data

Jan. 22, 1981 [JP] Japan .................. 56-7524[U]

[51] Int. Cl.⁴ .............................................. G08C 19/10
[52] U.S. Cl. ................................... 324/166; 340/870.37
[58] Field of Search ........................... 324/166, 61 R; 340/870.37; 318/662

[56] References Cited

U.S. PATENT DOCUMENTS

| | | |
|---|---|---|
| 3,668,672 | 6/1972 | Parnell .................. 340/870.37 |
| 3,760,392 | 9/1973 | Stich . |
| 3,873,916 | 3/1975 | Sterki . |
| 3,938,113 | 2/1976 | Dobson et al. . |
| 3,961,318 | 6/1976 | Farrand .................. 340/870.37 |
| 4,092,579 | 5/1978 | Weit . |
| 4,199,800 | 4/1980 | Weit . |
| 4,350,981 | 9/1982 | Tanaka .................. 340/870.37 |
| 4,418,347 | 11/1983 | Tanaka et al. . |
| 4,418,348 | 11/1983 | Tanaka et al. . |
| 4,423,417 | 12/1983 | Tanaka et al. . |

Primary Examiner—Stanley T. Krawczewicz
Assistant Examiner—Jose M. Solis
Attorney, Agent, or Firm—Cushman, Darby & Cushman

[57] ABSTRACT

An incremental encoder rotational position detecting apparatus for detecting the incremental rotational position of a rotating member includes a rotatable disk plate rotated with the rotating member, a stationary disk plate opposite to the rotatable plate, and a detector circuit for supplying a rectangular signal to the stationary plate. The stationary plate has first, second, third and fourth electrodes and an earth electrode grounded. The earth electrode is arranged between the first electrode and the third electrode to reduce a distribution capacitance produced between the first and third electrodes. The rectangular signals with opposite phase to each other are applied between the first and second electrodes or the third and fourth electrodes of the stationary plate.

2 Claims, 8 Drawing Figures

INCREMENTAL ENCODER ROTATIONAL POSITION DETECTOR

BACKGROUND OF THE INVENTION

The present invention relates to a rotation detector or more in particular to an electrode construction of an incremental encoder rotational position detector of electrostatic capacity type, which is capable of detecting the rotational speed of a rotary object such as an engine crank shaft of the automobile without delay regardless of the speed of the rotary object.

A conventional rotational position detector of electrostatic capacitance type comprises: a first plate including a first electrode having a plurality of electrode pieces radially arranged at equal spatial intervals and electrode pieces arranged radially between the electrode pieces of the first electrode; a third electrode and a fourth electrode; a second plate including 5th, 6th, 7th and 8th electrodes arranged oppositely to the first, second, third and fourth electrodes of the first plate respectively, the 5th electrode of the second plate being electrically connected to the 7th electrode thereof, the 6th electrode of the second plate being electrically connected to the 8th electrode thereof; means of supplying signals of opposite phases to the first and second electrodes of the first plate or the third and fourth electrodes thereof; and means of detecting the rotation of the second plate by detecting the change of the electrostatic capacitance generated between the first and second plates when the second plate is rotated in relation with the first plate.

The above-mentioned conventional electrode structure has such a disadvantage that among the signals of opposite phases applied to the first and second electrodes or the third and fourth electrodes of the first plate, the distributed capacitance formed mainly by the first and third electrodes causes the signal applied to the first or third electrode to be transmitted undesirably to the third electrode or the first electrode respectively, thus making it impossible to detect the signal satisfactorily, that is, to detect the rotation satisfactorily.

SUMMARY OF THE INVENTION

The present invention is intended to obviate this shortcoming and an object thereof is to provide an incremental rotation detector of electrostatic capacitance type in which an earth electrode of earth potential is added between the first and third electrodes, and thus by recuding the distributed capacitance between the first and third electrodes, the signal waveform applied to the first or third electrode is prevented from being transmitted to the third or first electrode respectively, thereby producing a satisfactory rotation signal.

DESCRIPTION OF THE PREFERRED EMBODIMENTS

Figure 1A:
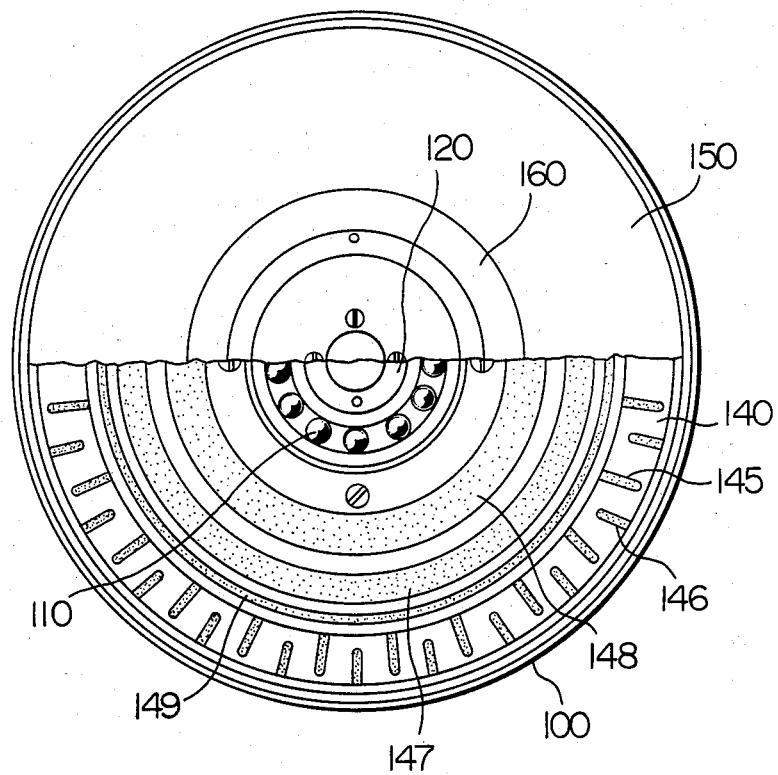
FIGS. 1a and 1b are a cross sectional view and a longitudinal sectional view respectively of the essential parts of an embodiment of the rotation detector containing plates having an electrode structure according to the present invention.
Figure 1B:
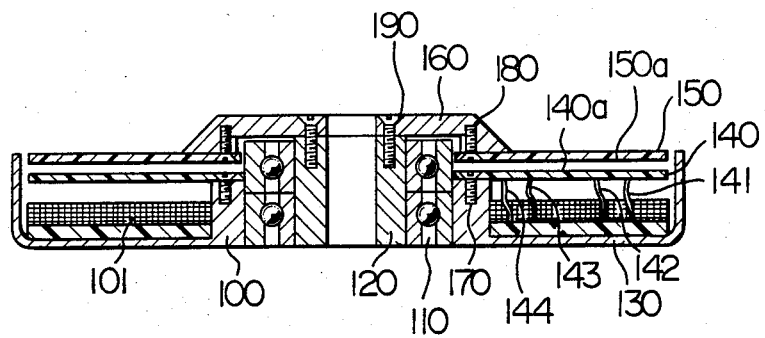

An embodiment of the present invention will be explained below with reference to the drawings. In FIGS. 1a and 1b, reference numeral 100 designates a housing fixed on the outside of a bearing 110, numeral 120 a shaft fixed on the inside of the bearing 110, which shaft 120 is coupled to, say, the crank shaft of the engine so that the rotation of the shaft 120 causes the rotation of the rotary object 160 fixed to the shaft 120 by screws 190. The rotary object 160 is fixed by screws 180 on the second plate 150 including a printed board formed with electrodes and adapted to rotate by the rotation of the rotaly object 160. The first plate 140, on the other hand, which also includes a printed board formed with electrodes is fixed on the housing 100 by screws 170, and is connected with signal lines 141, 142, 143 and 144 from a detector circuit section 101 mounted on the printed board 130 fixed on the housing 100.

Figure 2A:
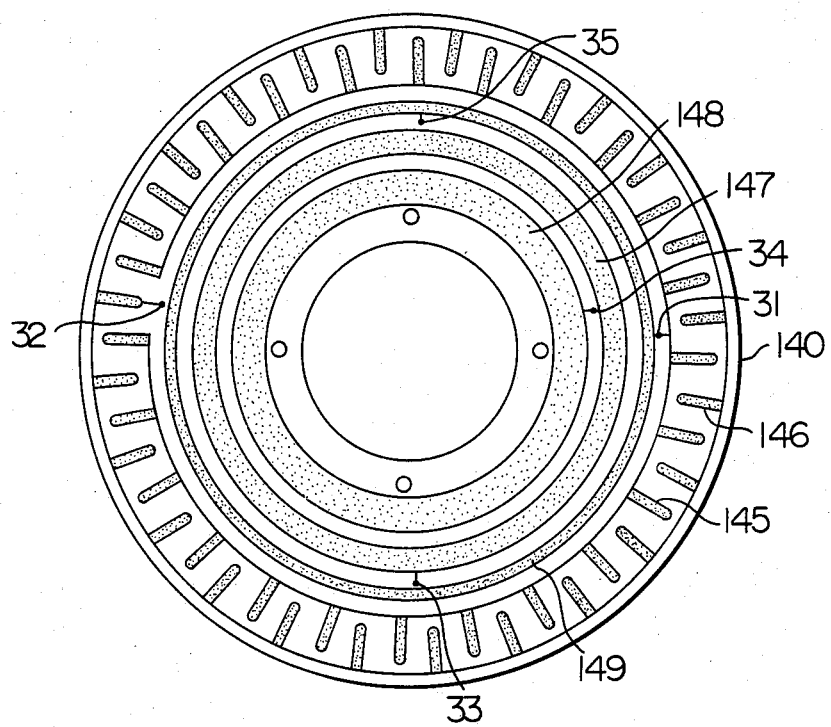
FIGS. 2a and 2b are front views of the electrode structures of the first and second plates respectively of the detector shown in FIG. 1.

FIG. 2a is a diagram showing the side 140a of the first plate 140 facing the second plate 150. The signal lines 141, 142, 143 and 144 are connected through connectors 31, 32, 33 and 34 respectively to the saw-toothed first electrode 145, the saw-toothed second electrode 146, and annular third electrode 147 and an annular fourth electrode 148 of the first plate 140. The electrode pieces of the first and second electrodes 145 and 146 are radially arranged along the circumference of the first plate in engaged and spaced relation to each other. The third and fourth electrodes 147 and 148 are arranged on the inside of the first and second electrodes 145 and 146, and an annular earth electrode 149 arranged between the first and third electrodes 145 and 147 is connected through a connector 35 to the grounding terminal of the detector circuit section 101.

Figure 2B:
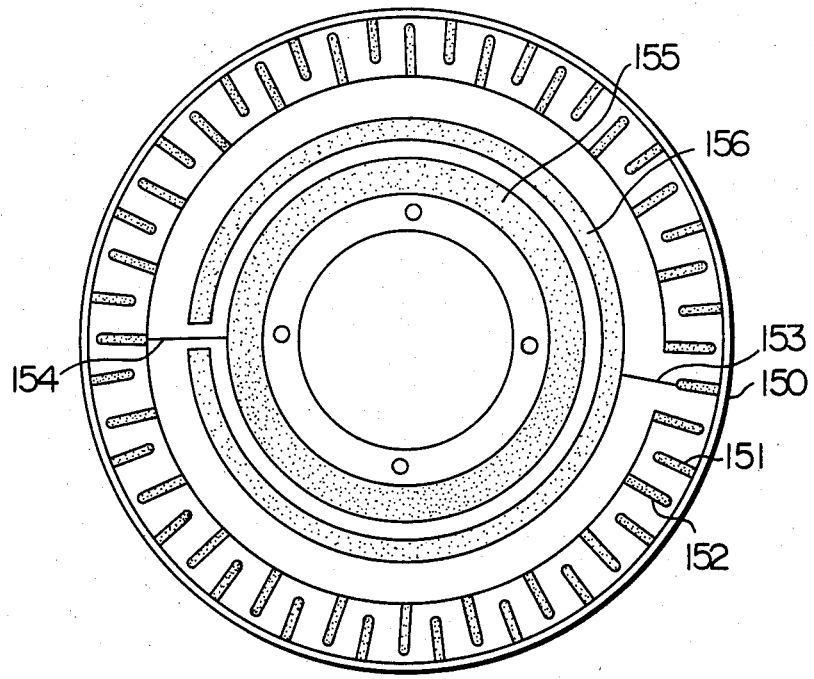

The side 150a of the second plate 150 which faces the first plate 140 is shown in FIG. 2b. The saw-toothed 5th electrode is connected through a lead wire 153 to the annular 7th electrode 156, and the saw-toothed 6th electrode 152 is connected through a lead wire 154 to the annular 8th electrode 155. The electrode pieces of the 5th and 6th electrodes 151 and 152 are arranged radially along the circumference in engaged and spaced relation with each other. The plates 140 and 150 are printed with the electrodes 146 and 151, the electrodes 145 and 152, the electrodes 147 and 156, and the electrodes 148 and 155 in opposition to each other respectively.

Figure 3:
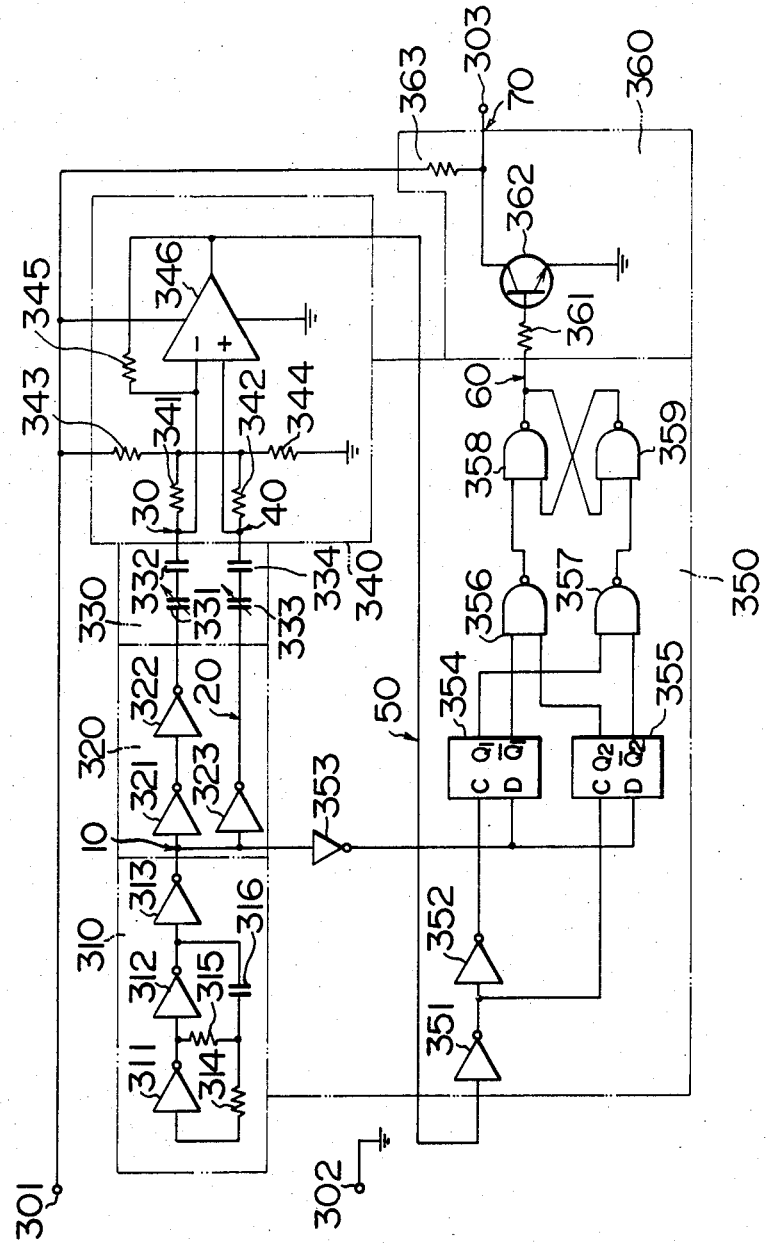
FIG. 3 an electrical circuit diagram showing an embodiment of a detector circuit section of the detector shown in FIG. 1.

An electrical circuit diagram of the detector circuit section 101 is shown in FIG. 3. In FIG. 3, the terminal 301 is a power terminal impressed with a constant voltage Vc. The terminal 302 is a grounding terminal. Numeral 310 designates a well-known CR oscillator circuit, numeral 320 a reference signal generator, numeral 330 a detector section including the upper electrodes 151, 152, 156, 155, and lower electrodes 146, 145, 147, 148, numeral 340 a comparator circuit, numeral 350 a phase detector circuit, numeral 360 an output circuit, and numeral 303 an output terminal.

The operation of the apparatus having the above-mentioned construction will be described. In FIG. 3, an oscillator circuit including the CR oscillator circuit 310 having inverter gates 311, 312, 313, resistors 314, 315 and a capacitor 316 produces an oscillation waveform as shown in FIG. 5(a). This oscillation waveform 10 is applied to the reference signal generator 320 for producing a signal of the same phase as the oscillation waveform 10 and a signal 20 of opposite phase shown in FIG. 5(b).

Figure 4A:
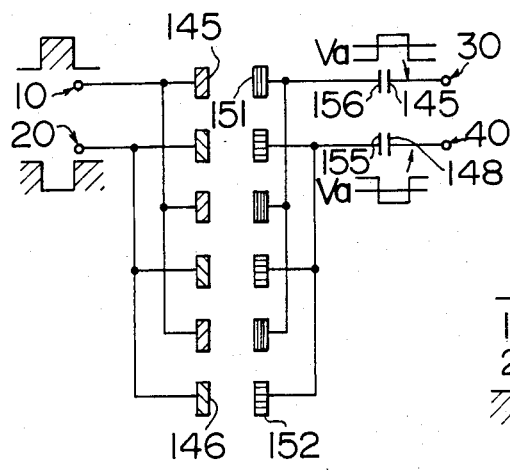
FIGS. 4a and 4b are electrical circuit diagrams showing the positional relations of the electrodes upon rotation of a rotary object for explaining the operation of the detector shown in FIG. 1.
Figure 4B:
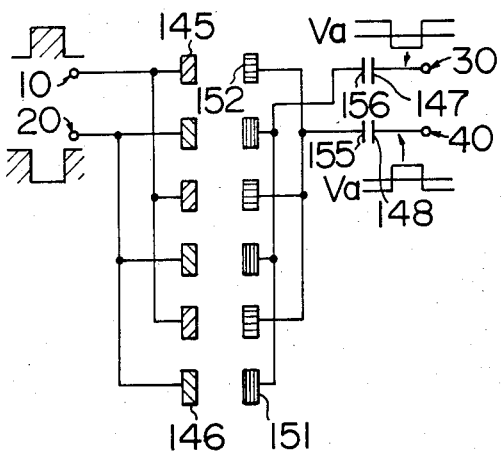
Figure 5:
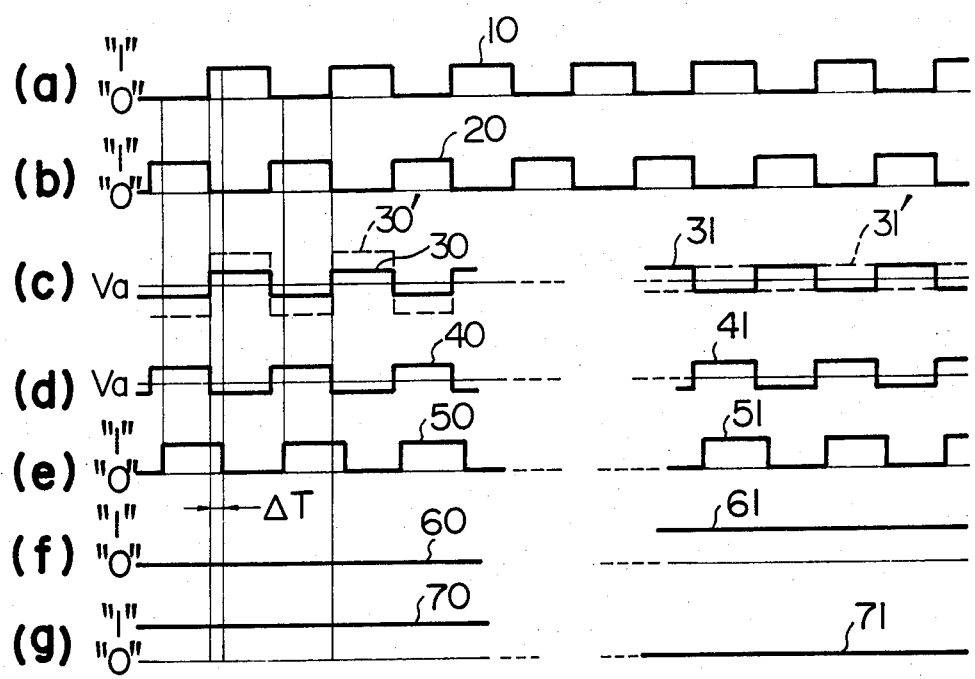
FIG. 5 shows signal waveforms at various parts for explaining the operation of the embodiment shown in FIG. 3.

As shown in FIG. 5(a), when the shaft 120 (as illustrated in FIG. 1) rotates, the second plate 150 rotates along therewith so that its 5th electrode 151 opposes the first electrode 145 of the first plate 140 and that the 6th electrode 152 of the second plate 150 opposes the second electrode 146 of the first plate 140. At this time, when the signal in phase with the oscillation waveform 10 is applied through the signal line 141 to the first electrode 145 of the first plate 140, a signal in phase with the oscillation waveform 10 is produced at signal line 153 through a capacitor (as represented by 331 in FIG. 3) formed by the electrode 145 of the first plate 140 and the 5th electrode 151 of the second plate 150. Then, this signal is transmitted through a capacitor (represented by 332 in FIG. 5) formed by the 7th electrode 156 of the second plate 150 and the third electrode 147 of the first plate 140, and through the connector 33 to the comparator 340 as a signal 30 shown in FIG. 5(c). Similarly, the signal 20 transmitted through the signal line 142 to the second electrode 146 of the first plate 140 is applied through a capacitor (shown at 333 in FIG. 3) formed by the second electrode 146 and the 6th electrode 152 of the second plate 150, to the 6th electrode 152 of the second plate 150 as a signal in phase with the signal 20. Then, this signal is fed through a capacitor (shown at 334 in FIG. 3) formed by the 8th electrode 155 of the second plate 150 and the fourth electrode 148 of the first plate 140, and through the connector 34 to the comparator 340 as a signal 40 shown by FIG. 5(d). If the earth electrode 149 is lacking, the distributed capacitance formed by the first electrode 145 and the third electrode 147 of the first plate 140 as shown by the dashed line in FIG. 4 causes the signal applied to the first electrode 145 (the signal in phase with the oscillation waveform 10) to be applied to the third electrode 147, which signal is interposed on the signal 30 (shown in FIG. 5) and appears at the terminal 33 (the signal 30' in FIG. 5). At this time, the signal 10 is in phase with the signal 30, so that the same operation is effected regardless of the presence or absence of the earth electrode 149.

However, the signals 30, 31 and 40 take the waveform based on the voltage $V_a$ shown by FIGS. 5(c) and 5(d) and which is determined by resistors 343 and 344 of the comparator 340. These signals 30 and 40 are amplified by a differential amplifier which is formed of a resistor 345 and an operational amplifier (hereinafter, referred to simply as OP amp) 346 in the comparator 340. Thus, this differential amplifier produces a signal 50 which is, as shown by FIG. 5(e), delayed by time $\Delta T$ with respect to the oscillation waveform 10, where $\Delta T$ is the delay time in the capacitor response and the switching of the OP amp 346. The signal 50 is shaped in waveform by inverter gates 351 and 352 of the phase detector 350. Thus, to the clock terminal of a D-type flip-flop 354 is applied a signal in phase with the signal 50, and to the clock terminal of a D-type flip-flop 355 a signal opposite in phase to the signal 50. The signal opposite in phase to the oscillation waveform 10 is applied from the CR oscillator 310 through an inverter gate 353 to the data terminals of the D-type flip-flops 354 and 355. Consequently, the D-type flip-flop 354 takes "1" state at the output terminal $Q_1$ and the D-type flip-flop 355 takes "0" state at the output terminal $Q_2$. Then, the stage of NAND gates 356, 357, 358 and 359 thus supplies "0" signal shown by FIG. 5(f) to a signal line 60. This signal is applied to the output circuit 360 in which it is fed through a resistor 361 to a transistor 362, which is thus caused to turn off. As a result, at the output terminal 303 there appears a signal "1" (a signal 70 shown by FIG. 5(g)) indicating that the 5th electrode 151 of the seocnd plate 150 opposes the first electrode 145 of the first plate 140 (or the 6th electrode 152 of the second plate 150 opposes the second electrode 146 of the first plate 140).

Moreover, as shown in FIG. 4b, when the 5th electrode 151 of the second plate 150 comes to be opposite to the second electrode 146 of the first plate 140 and the 6th electrode 152 of the second plate 150 to the first electrode 145 of the first plate 140, the signal in phase with the signal 20 appears at the 5th electrode 151 of the second plate 150. Then, to the third electrode 147 of the first plate 140 is applied a signal 31 with the reference potential of $V_a$ as shown by FIG. 5(c). In addition, the signal in phase with the oscillation waveform 10 appears at the 6th electrode 152 of the second plate 150, and then to the fourth electrode 148 of the first plate 140 is applied a signal 41 with the reference potential of $V_a$ as shown by FIG. 5(d). If the earth electrode 149 is lacking, the existence of the distributed capacitance between the first electrode 145 and the third electrode 147 of the first plate 140 as mentioned above causes a waveform in phase with the oscillation waveform 10 to be applied to the connector 33. In an extreme case, the signal at the connector 33 takes a waveform opposite to the waveform 31 as shown by numeral 31' in FIG. 5(c), resulting in an unstable operation. In order to solve this problem, the embodiment of FIG. 2 is such that as mentioned above, the earth electrode 149 is inserted between the first electrode 145 and the third electrode 147 of the first plate 140 thereby to eliminate the signal transmission which otherwise might occur by the distribution capacitance of the first electrode 145 and the third electrode 147. In this way, only a signal 31 shown in FIG. 5(c) is produced at the terminal 30. At this time, to the output terminal of the comparator 340 is applied a signal 51 as shown by FIG. 5(e) and thus at the output terminal of the phase detector 350 there appears a signal 61 as shown by FIG. 5(f). Consequently, to the output terminal 303 is applied a signal "0" (a signal 71 as shown by FIG. 5(g)) indicating that the 5th electrode 151 of the second plate 150 is opposite to the second electrode 146 of the first plate 140.

Thus, when the 5th and 6th electrodes 151 and 152 provided on the second plate 150 are passed above the first and second electrodes 145 and 146 provided on the first plate 140 as the shaft 120 rotates, signals of "1" and "0" alternately appear at the output terminal 303, thereby eanabling incremental detection of the rotation of the second plate 150, or the shaft 120. Thus, the present invention provides a signal which is indicative of detected incremental rotation (i.e. angular position changes).

As described above, the annular electrode 149 is added between the first electrode 145 and the third electrode 147 of the first plate 140. This prevents the waveform 10 applied to the first electrode 145 from being applied to the third electrode 147 by the distributed capacitance formed by the first electrode 145 and the third electrode 147, so that the signal produced at the 7th electrode 156 of the second plate 150 is transmitted to the third electrode 147 of the first plate 140 satisfactorily.

In the aforementioned embodiment, the first and second electrodes 145 and 146 of the first plate 140 are impressed with signals of opposite phases to produce signals from the third and fourth electrodes 147 and 148 of the first plate 140. As an alternative to this, the third and fourth electrodes 147 and 148 of the first plate 140 may be impressed with signals of opposite phases thereby to produce signals at the first and second electrodes 145 and 146 of the first plate 140 with equal effect.

We claim:

1. An incremental rotational position detector of electrostatic capacitance type comprising:
    a first plate including a first electrode having a plurality of electrode pieces arranged radially at equal spatial intervals to each other, a second electrode having a plurality of electrode pieces arranged radially between said electrode pieces of said first electrode, annular third and fourth electrodes, and an annular earth electrode arranged between said first and third electrodes and set to the earth potential;
    a second plate including 5th, 6th, 7th and 8th electrodes arranged in opposed relation to said first, second, third and fourth electrodes of said first plate respectively, said 5th electrode and said 7th electrode of said second plate being electrically connected to each other, said 6th electrode and said 8th electrode of said second plate being electrically connected to each other; and
    a detector circuit for supplying signals of opposite phases to selected one of the pair of said first and second electrodes of said first plate and the pair of said third and fourth electrodes thereof, so that the change of the electrostatic capacitance generated between the electrodes of said plates when said second plate is rotated in relation with said first plate is detected thereby to detect an incremental rotational position of said second plate.

2. An incremental encoder rotational position detecting apparatus for detecting an incremental rotational position of a rotating member comprising:
    a stationary disk plate supported in a stationary relation to said rotating member and provided with first and second toothed electrodes electrically insulated from each other, first and second circular electrodes electrically insulated from each other and an earth electrode of ring shape arranged between said first toothed electrode and said first circular electrode, said first and second toothed electrodes each having a plurality of equispaced radial teeth electrically connected with each other, the radial teeth of said first and second toothed electrodes being arranged alternately, said earth electrode being connected to an earth potential point, and said first and second circular electrodes being insulated electrically from said first and second toothed electrodes;
    a rotatable disk plate rotated by said rotating member and provided with third and fourth toothed electrodes insulated electrically from each other and third and fourth circular electrodes insulated electrically from each other, said third and fourth toothed electrodes each having a plurality of equispaced radial teeth, the radial teeth of said third and fourth toothed electrodes being arranged alternately, said third circular electrode being electrically connected to said third toothed electrode and said fourth circular electrode being electrically connected to said fourth toothed electrode, and said third and fourth toothed electrodes and said third and fourth circular electrodes being arranged to face said first and second toothed electrodes and said first and second circular electrodes of said stationary disk plate with a spacing respectively; and
    An incremental position detecting circuit for supplying signals with oposite phase with each other to the first and second toothed electrodes or the first and second circular electrodes of said stationary plate to detect the incremental rotational of said rotatable plate in accordance with the change of a static capacitance occuring between the electrodes of said stationary and rotatable plates as said rotatable plate rotates relative to said stationary plate.

* * * * *